United States Patent [19]

Ferenczi et al.

[11] 4,437,060
[45] Mar. 13, 1984

[54] METHOD FOR DEEP LEVEL TRANSIENT SPECTROSCOPY SCANNING AND APPARATUS FOR CARRYING OUT THE METHOD

[75] Inventors: György Ferenczi; Péter Horváth; Ferenc Tóth; József Kiss; János Boda, all of Budapest, Hungary

[73] Assignee: Magyar Tudományos Akadémia Müszaki Fizikai Kutató Intézete, Budapest, Hungary

[21] Appl. No.: 269,903

[22] Filed: Jun. 3, 1981

[30] Foreign Application Priority Data

Jun. 7, 1980 [HU] Hungary .............................. 1439/80

[51] Int. Cl.³ .......................................... G01R 31/26
[52] U.S. Cl. .............................. 324/158 D; 324/60 C
[58] Field of Search ........... 324/158 D, 158 T, 158 R, 324/60 C

[56] References Cited

U.S. PATENT DOCUMENTS 3,859,595 1/1975 Lang ................................ 324/158 D

FOREIGN PATENT DOCUMENTS 2631783 1/1978 Fed. Rep. of Germany .

OTHER PUBLICATIONS

Miller et al.; "Transient Capacitance . . . "; Rev. of Sci. Instrum.; vol. 48; No. 3; Mar. 1977; pp. 237–239.
Ambrozy et al.; "Measuring Instruments . . . "; Periodica Polytechnica; Elect. Eng.; vol. 14; No. 3; pp. 301–310.
Nagasawa et al.; "Fast Transient . . . "; Appl. Phys.; vol. 8; No. 1; Sep. 1975; pp. 35–42.
Ambrozy, A.; "A Simple . . . "; Solid-State Electronics; vol. 13; 1970; pp. 347–353.
Rozhkov et al.; "Measurement of the Volt-Capacitance . . . "; Inst. and Epx. Tech.; vol. 14; No. 6; Nov./Dec. 1971; pp. 1729–1730.
Borsuk et al.; "Current Transient . . . "; IEEE Trans. on Electron Devices; vol. ED-27; No. 12; Dec. 1980; pp. 2217–2225.

Primary Examiner—Ernest F. Karlsen
Attorney, Agent, or Firm—Toren, McGeady and Stanger

[57] ABSTRACT

A Deep Level Transient Spectroscopy (DLTS) method in which a high frequency measuring signal is applied continuously on a semiconductor junction, and exciting pulses are generated which are coupled through fast semiconductor switching elements to the junction to alternatively bias the junction in reverse and forward (or slightly reverse) directions. The high frequency measuring signal passed through the junction is evaluated by means of a lock-in amplifier phase-locked with a constant phase angle, independent of the repetition rate of the exciting pulses.

The evaluation circuits of the apparatus including the lock-in amplifier are controlled by switching elements driven by control signals generated from the exciting pulses.

8 Claims, 3 Drawing Figures

METHOD FOR DEEP LEVEL TRANSIENT SPECTROSCOPY SCANNING AND APPARATUS FOR CARRYING OUT THE METHOD

FIELD OF THE INVENTION

The invention relates to deep level transient spectroscopy technique called generally as DLTS technique and more particularly to a method for carrying out DLTS scanning on a semiconductor junction by measuring a predetermined sequence of the transient capacitance changes of the junction. The invention relates also to an apparatus for carrying out the method.

BACKGROUND ART

It is well-known in the art that by the measurement of the capacitance change versus time curves of the depletion region or space charge layer near PN junctions in semiconductor devices the concentration, activation energy, thermal and optical capture cross-sections of localized states (created by foreign atoms, point defects, dislocations, etc.) in the forbidden gap of the semiconductor devices can be determined.

The change of the occupancy of the localized states in the forbidden gap can be measured as a change of the capacitance. During such measurements the localized states are periodically filled and emptied, and the amplitude of the resulting periodical capacitance-change is determined by the concentration of the energy states, while the kinetics thereof is determined by the activation energies and thermal capture cross-sections of the localized states as a function of temperature.

The occupancy of the localized states are changed by voltage-, current- or light-pulses applied to the PN junction. This measuring method is the deep level transient spectroscopy or DLTS method as referred to hereinabove, and the instruments utilising this method are indispensable factors of development and quality control works in the field of semiconductor devices.

The DLTS method is described in the paper of G. L. Miller, D. V. Lang and L. C. Kimerling entitled "Capacitance Transient Spectroscopy" (Ann. Rev. Metr Sci. 1977, pp 377–348) and here the authors also give a survey on the instrumentation used for the measurements of transient capacitance changes.

The measurement of the capacitance changes is carried out in such a way that the diode representing the semiconductor junction to be measured is connected into one arm of a bridge, and a compensating capacitance is inserted in the other arm of the bridge having a capacitance equal to that of the diode. A high frequency signal is applied to the two arms of the bridge through a symmetrical high frequency transformer.

In addition to the application of the high frequency signal a train of pulses is applied to the diode through a pulse-transformer. The repetition rate and the duty cycle of the pulses can be adjusted within wide ranges in accordance with the DLTS method. During the occurrence of the pulses a forward or slightly reverse voltage is applied to the diode, and between the ending moments of the pulses and the starting moments of the subsequent pulses a high reverse voltage is applied to the diode. The capacitance of the diode is substantially different under the two kinds of voltages applied thereto which difference can be as high as 2-3 decimal orders of magnitude, and during the presence of the reverse bias a capacitance transient (a decay) takes place which is typically by 4 decimal orders of magnitude smaller than the d.c. reverse capacitance.

The task of the measurement is to determine the small capacitance changes during the reverse biasing pulses.

In a known measuring apparatus the output of the measuring circuit is rectified by a phase-sensitive (lock-in) rectifier following a sufficient amplification, and the so obtained pulsating rectified voltage will be proportional to the capacitive output signal component of the measuring circuit. This voltage is applied to the input of a low-frequency further lock-in amplifier synchronized to the starting moments of the measuring periods, and the second lock-in amplifier selects the component from the rectified pulsating input voltage which has the same frequency as the measuring periods have.

During performance of the DLTS method the temperature and other parameters of the diode to be measured are changed and such changes take place much slower than the rate of pulses applied to the diode. The information characterizing the properties of the diode is carried by the registrated sequence of capacitance changes obtained during the pulse periods with reverse bias.

There are a number of problems connected with the known apparatus summarized above.

The application of the excitation pulses is rather complicated, and in the described arrangement the stray capacitance and series inductance of the pulse transformer can result in pulse parameters other than the set values, especially if there are high conductive losses. The true transmission of pulses with durations that can be varied within a wide range, which wide range is required for the measurements of the capture cross-section of majority or minority carriers, can be solved precisely by using a plurality of pulse-transformers only.

The measuring amplifier receives the full driving signal, and following the significant overloading it can recover relatively slowly, i.e. the ineffective death period of the capacitance measurement will be long, i.e. the starting section of the exponentially decaying capacitance signal will be lost for the measurement, which all result in a substantially decreased signal to noise ratio compared to an ideal case. If the starting of the reference signal of the low-frequency lock-in amplifier is phase-locked to the starting or ending moments of the biasing pulses, then the death periods will have different lengths when the width and repetition rate of the pulses are changed, which result in inaccurate determinations of activation energies (D. S. Day et al. Journal of Applied Physics, 50/8, 5093/1979).

High sensitivity can be reached by averaging throughout a long period of time defined generally by the integrating time-constant of the low frequency lock-in amplifier. If the high-frequency gain is high, the high-frequency phase-sensitive rectifier, which can have only short time constant for the sake of good transient response, might overdrive the low frequency lock-in amplifier that has a long time constant and a corresponding long recovery period following an overdriving. In order to overcome such unwanted side-effects, neither the high-frequency, nor the low frequency gain can be sufficiently high, i.e. the sensitivity of the capacitance measurements cannot be increased as it would be desirable.

OBJECTS OF THE INVENTION

The primary object of the invention is to improve the DLTS method in such a way, in which the measurements carried out by different excitation pulses can be compared to each other inambiguously.

A further object of the invention is to provide an apparatus for carrying out the DLTS method, which is free from the limitations coming from the application of pulse transformers and in which the overloading of the stages following the measuring circuits can be avoided during the duration of the pulses.

SUMMARY OF THE INVENTION

According to the first aspect of the invention the measurements carried out with different pulse repetition rates will be comparable with each other if following the ending moments of the pulses the respective measuring periods are started in constant phase positions relative to the pulse repetition frequency. This condition means substantially that the length of the death periods form a constant portion of the period times of the respective pulses.

In the apparatus according to the invention the application of the pulse transformers has been omitted and the pulses are coupled through controlled switches driven by a control unit to the diode to be measured.

In order to prevent the lock-in amplifier from being overdriven and to simulate the missing measuring signal during the pulses, between the output of the high frequency phase-sensitive amplifier and the input of the low frequency lock-in amplifier a track-and-hold type integrating amplifier is coupled through respective controlled switches, and the measuring signals are passed only in the respective measuring periods to the input of the lock-in amplifier. Between the measuring periods a simulated (reconstructed) measuring signal is passed from the gated integrating amplifier to the input of the lock-in amplifier, in which the voltage of the simulated signal corresponds to the average of the measuring signal in the ending section of the previous measuring period.

BRIEF DESCRIPTION OF THE DRAWINGS

The invention will now be described in connection with a preferable embodiment thereof in which reference will be made to the accompanying drawings. In the drawing.

DESCRIPTION OF PREFERRED EMBODIMENTS

Figure 1:
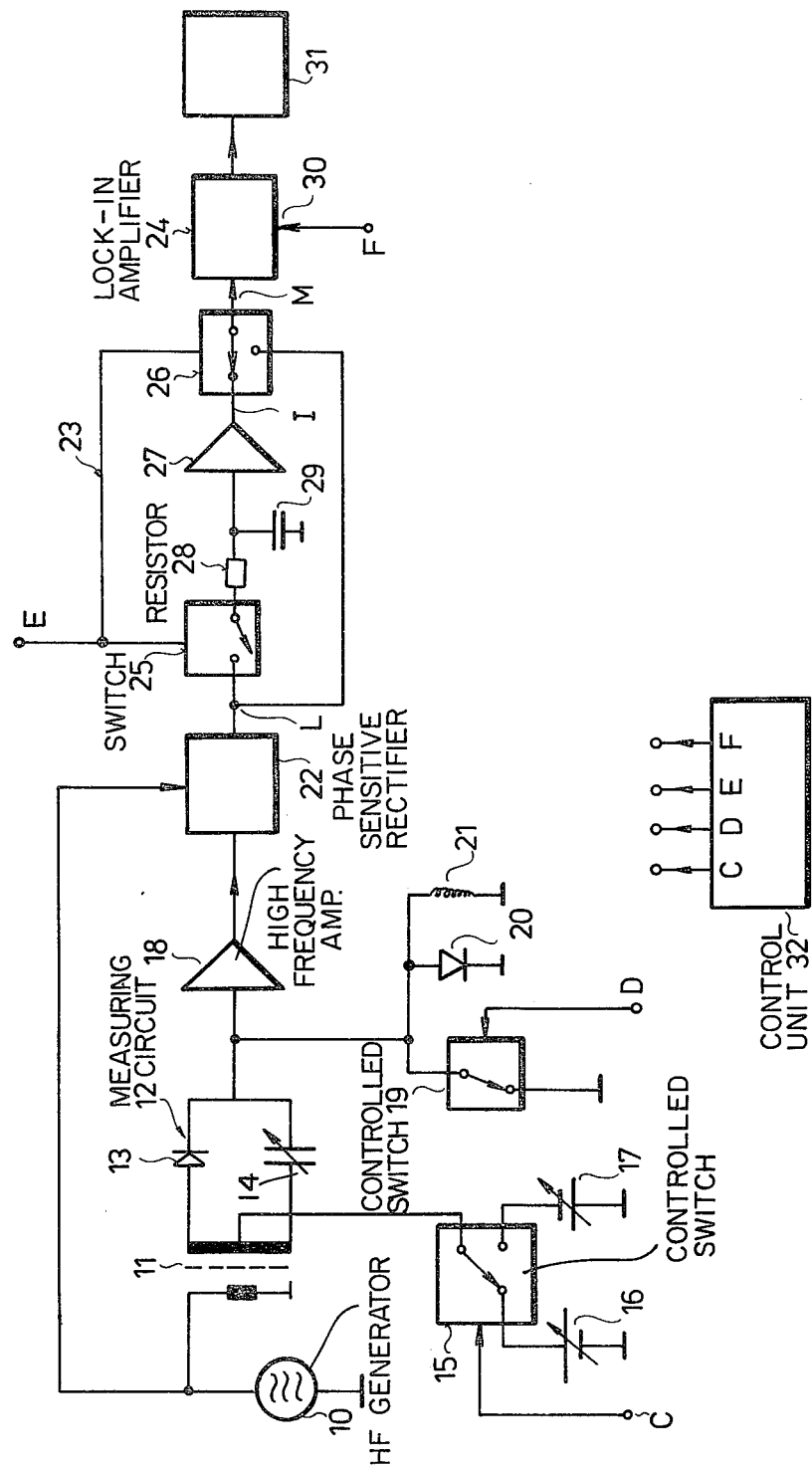
FIG. 1 shows the block diagram of an embodiment of the apparatus according to the invention

FIG. 1 shows the functional block diagram of the apparatus according to the invention for measuring capacitance changes. A high frequency generator 10 provides sine-waves with constant amplitude and frequency. The frequency of the generated HF signals is typically 1 MHz which, depending on the requirements of actual tasks, can be varied freely between about 1 and 30 MHz. The output of the HF generator 10 is coupled through a high frequency transformer 11 to the measuring circuit 12. The measuring circuit 12 comprises a diode 13 representing the semiconductor junction which is to be measured and a compensating capacitor 14 with adjustable capacitance. The HF transformer 11 has a symmetrical secondary winding, and the two end terminals thereof are coupled to the measuring circuit 12, while its central tapping is connected through a controlled switch 15 to either of DC sources 16 or 17 as defined by the actual switching position. The voltage of the DC sources 16 and 17 can be adjusted to correspond to the requirements of the measurement. The typical output voltage of the DC source 17 is −10 V which can change between about −0.5 V and −20 V and the typical voltage range of the DC source 16 is between −1 V and +2 V. The position of the controlled switch 15 is defined by the value of a control voltage C coupled to its control input. The output of the measuring circuit 12 is coupled to a high frequency amplifier 18 providing a predetermined selective gain in the operational frequency of the HF generator 10.

A second controlled switch 19 is connected to the input of the HF amplifier 18 which depending on the value of a control voltage D coupled to its control input either earths the output of the measuring circuit 12 or isolates the same from the ground. A parallel member consisting of diode 20 and choke 21 is connected in parallel to the controlled switch between the ground and the output of the measuring circuit 12, in which the choke 21 is used for closing the DC path of the diode 20.

The controlled switches 15 and 19 can be realized preferably by VMOS FET devices which can be arranged as it is shown e.g. in FIG. 1 of APPLICATION NOTE AN77-2 of the Company Siliconic Semiconductor Devices, or as it is published in the article of Walt Heinzer: "Don't Trade Off Analog Switch Specs." (Electronic Design, October 1977). The two branches of the controlled switch 15 can be implemented preferably by N and P channel transistors. For such applications good results can be obtained by the VMOS FET devices Type: BD 212 and BD 222 of ITT.

The output of the HF amplifier 18 is coupled to a phase-sensitive rectifier 22 having a reference input connected to the output of the HF generator 10. The phase of the reference signal of the phase-sensitive rectifier 22 is adjusted in such a way that the output of the latter represents a DC voltage corresponding to the capacitive voltage component being present at the output of the measuring circuit 12.

The circuits described hereinabove form substantially a capacitance measuring unit. The output signal of this unit is coupled through a transmission gate 23 to the signal input of a low frequency lock-in amplifier 24. The transmission gate 23 consists of controlled switches 25 and 26 and of an amplifier 27 with an integrating input coupled between the controlled switches 25 and 26. The integrator at the input of the amplifier consists of resistor 28 and capacitor 29. The control inputs of the switches 25 and 26 are interconnected and are coupled to a common control voltage E. The switches 25 and 26 have always complementary states.

The lock-in amplifier 24 receives the pulsating DC voltage with specific properties (described later) coming from the output of the transmission gate 23 and performs a phase-sensitive rectification function on the input signal phase-locked to a square-wave control voltage F coupled to its square-wave input 30. The so obtained DC voltage is recorded by the X channel of an X-Y recorder or fed to any other kind of registrator.

Figure 2:
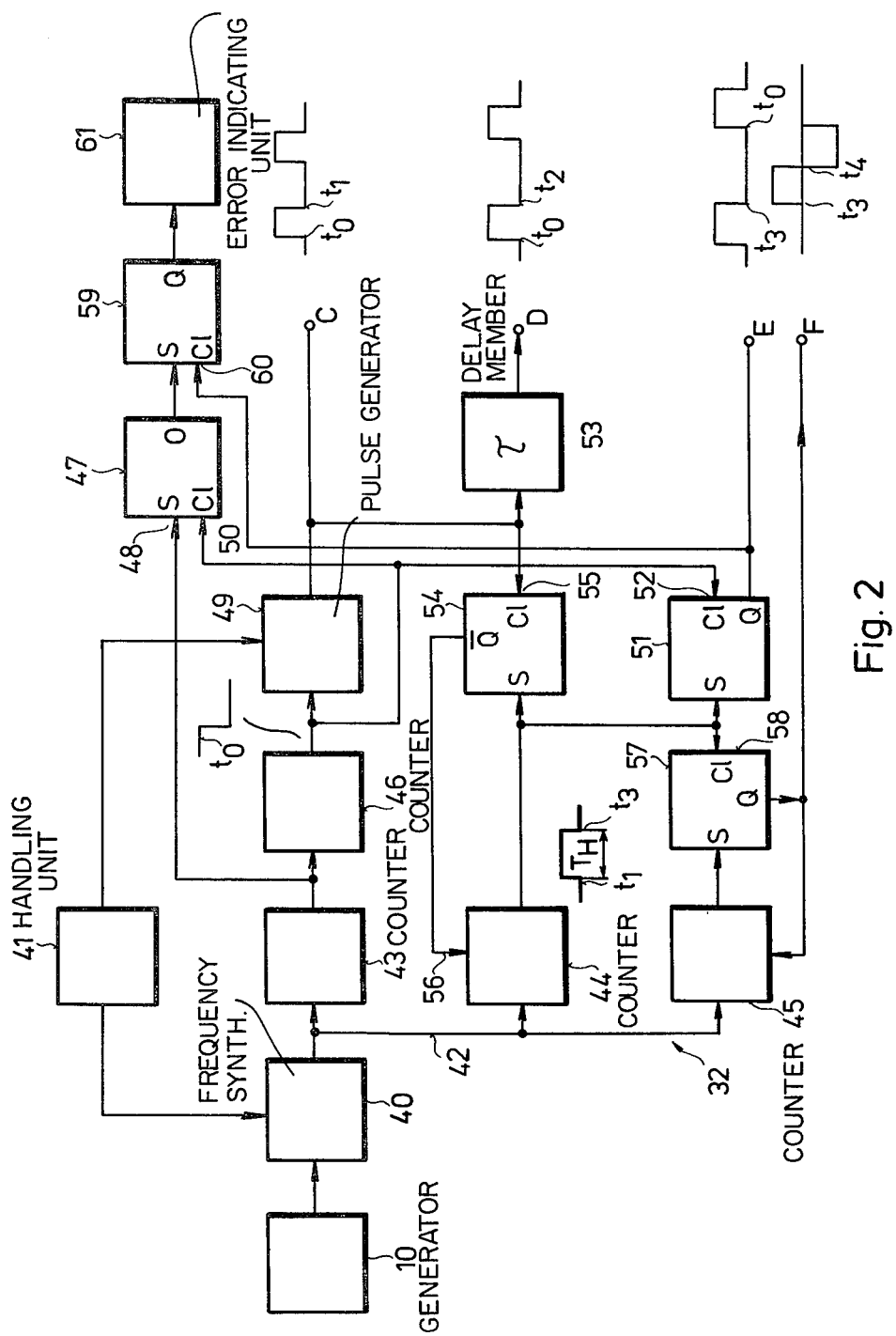
FIG. 2 shows the detailed block diagram of the control unit 32 shown in FIG. 1.

The control voltages C, D, E and F for the controlled switches 15, 19, 25 and 26 and for the lock-in amplifier 24 are generated by a control unit 32 shown in FIG. 2.

The operation of the capacitance-change measuring apparatus shown in FIG. 1 will be described with reference to the time diagrams of FIG. 3.

As it was already mentioned the HF generator 10 provides signals with high frequency stability and constant amplitude (e.g. sine waves of 1 MHz) coupled through the HF transformer 11 to the measuring circuit 12. Before the beginning of a measurement the voltage (e.g. −10 V) of the DC source 17 is coupled to the diode 13 and a voltage minimum is adjusted by the compensating capacitor 14 at the output of the phase-sensitive rectifier 22. The capacitance of the compensating capacitor 14 should be adjustable substantially within the expected range of the reverse-biased junction capacitance of the test diode which falls typically between 1 pF and 100 pF. After balancing the measuring circuit 12 the measurement of capacitance-changes can be started. The measurement is carried out in accordance with the principle of the DLTS technique referred to hereinbefore, in which the semiconductor to be measured is exposed to various thermal effects. For understanding the measurement process the knowledge of the thermal handling of the semiconductor device represented by the diode 13 is not necessary.

Figure 3:
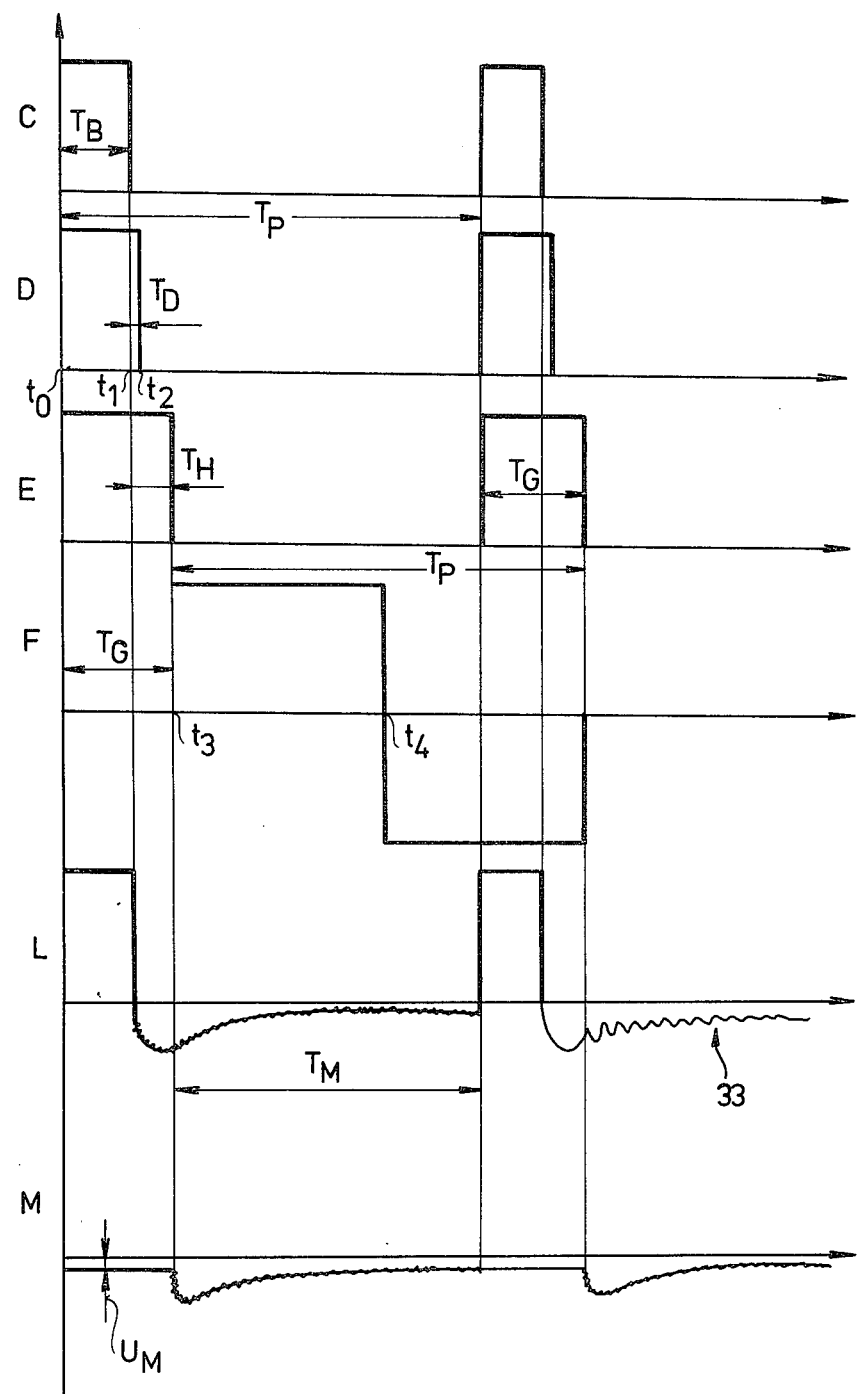
FIG. 3 shows the time diagrams on characteristical points of the apparatus shown in FIGS. 1 and 2.

The control unit 32 is used to provide control voltages by which the states of the controlled switches 15 and 19 are periodically changed as illustrated in diagrams C and D in FIG. 3. The duration of period time $T_P$ can be adjusted according to actual requirements typically between 2 sec and 0.4 msec. During the occurrence of the control voltage C the diode 13 receives the voltage of the DC source 16 which is e.g. +1 V and under such a DC voltage its capacitance will be substantially higher than it had been with reverse bias. The increase in capacitance can be as high as 2 or 4 decimal orders of magnitude. The control pulse C lasts through a period $T_B$ and during this time the voltage at the output of the phase-sensitive rectifier 22 will be as shown in diagram L of FIG. 3. The essence of the measurement method will not be influenced if the control pulse C is composed of a number of shorter pulses within the period $T_B$, which pulses might have even different amplitudes. The discrete pulsating excitation offers a possibility e.g. for measuring the capture cross-section not only of the hole but also of the electron of a minority carrier trap. The input of the HF amplifier 18 is shunted to earth by the controlled switch 19 during the period $T_B$, however, the HF signal arriving from the output of the measuring circuit 12 provides even with grounded amplifier a relatively high voltage response at the output of the phase-sensitive rectifier 22.

When the control voltage C is finished in moment $t_1$, the controlled switch 15 changes its state and passes the voltage of −10 V of the DC source 17 to the diode 13, and in response to such a bias the capacitance of the diode 13 will rapidly decrease and a corresponding decrease or change in the output voltage of the phase-sensitive rectifier 22 will be obtained. The shunt from the output of the measuring circuit 12 will be released in moment $t_2$ when the controlled switch 19 is operated, and the moment $t_2$ is delayed by approximately 20 nsec compared to the moment $t_1$. This delay is required due to the fact that the measuring signal can pass to the input of the HF amplifier 18 only when the switching transient processes of the controlled switch 15 have already finished. The capacitance of the diode 13 is quickly decreasing following the moment $t_1$, and in accordance with the DLTS technique the object of the measurement lies even in the correct recording of this capacitance-change.

The voltage at the output of the phase-sensitive rectifier 22 (diagram L in FIG. 3) depends on the difference between the capacitance of the diode 13 and of the compensating capacitor 14 and on the sign of this difference.

The beginning of the actual measurement period is defined in the moment $t_3$ determined by the beginning of the square wave coupled to the reference input of the lock-in amplifier 24. The control voltage F begins in the moment $t_3$ which is delayed by a period $T_G$ compared to the starting moment $t_o$ of the control voltage C. The frequency of the control voltage F is $1/T_P$. The time delay $T_G$ is composed of two factors i.e. of the pulse time $T_B$ of the control voltage C and of a dead period $T_H$ defined between the end moment of the control voltage C and the beginning moment $t_3$ of the measurement. It should be noted that for illustrating purposes the time scale in FIG. 3, especially between the moments $t_o$ and $t_3$ is rather distorted.

The duration of the period $T_B$ is adjustable with a minimum value of about 50 nsec. The maximum length of that period depends on the required accuracy and on the repetition frequency. The suitable adjustment of the dead period $T_H$ is of outstanding importance regarding the reproducibility of different measurements. The moment $t_3$ falls namely in the rapidly changing section of the capacitance curve, and if the beginning moment of the measuring window is chosen arbitrarily, then the evaluation of data obtained by different measurements carried out with different repetition frequencies might lead to the drawing of incorrect consequences.

A basic idea of the present invention lies in that the moment $t_3$ which defines the beginning of the measurement should be delayed relative to the ending moment $t_1$ of the control pulse with such an extent that this delay should represent the same phase shift compared to the control voltage C having a period time $T_P$ and frequency $f_P$. This statement is equivalent by the definition that in case of any frequency $f_P$ the equation:

$$T_P = k \cdot T_H$$

is true, in which k=constant. In practical applications it is preferable if k=25.

The useful measuring period $T_M$ can be obtained by the equation: $T_M = T_P - T_G$, wherein $T_G = T_B + T_H$.

The accuracy of the measurement is proportional to the quotient $T_G/T_P$. It can be proved that until the quotient $T_G/T_P$ is smaller than 0.1 the accuracy of the concentration measurement of the examined doping level is better than 1%. With such data if the repetition frequency is chosen to be $f_P = 2$ kHz, the pulse width of the control voltage can be $T_B = 30$ μsec and if the frequency is decreased to $f_P = 50$ Hz, the pulse width can be increased to $T_B = 1.2$ msec with the same accuracy of 1%.

According to the above conditions the length of the dead period $T_H$ should be adjusted to be proportional to the period time $T_P$. The response time of the capacitance measuring apparatus shown in FIG. 1 is about 2 μsec. In definition the response time is the length of the period in which the capacitance following the moment $t_1$ decreases from the 90% of its value in the moment $t_1$ to 10% of the same value. In order to reach the original capacitance value (with reverse bias) with an accuracy of $\Delta C/C = 10^{-4}$, eight times as much time should be waited with the beginning of the measuring period i.e. the waiting period is 16 μsec. This period is called as setting time. If the maximum of the repetition frequency $f_P = 2.5$ kHz, then the setting time of 16 μsec is the 1/25th part of the period time $T_P$ corresponding to this frequency. This explains the value 25 for k.

The transmission gate 23 protects the signal input of the lock-in amplifier 24 from the high signal amplitude coming out from the output of the phase-sensitive rectifier 23 during the period $T_G$ (FIG. 3 diagram L) which might result in the overdriving of the input circuitry of the lock-in amplifier. During the period $T_G$ a signal shown in diagram M of FIG. 3 is coupled to the signal input of the lock-in amplifier 24. The output of the phase-sensitive rectifier 22 is coupled by the controlled switch 26 only during the measurement period $T_M$ to the input of the lock-in amplifier 24. During the period $T_G$ the controlled switches 25 and 26 take the conditions illustrated in FIG. 1 in response to the control voltage E, and in that period the amplifier 27 acts as a track-and-hold type sampling circuit which couples a voltage $U_M$ (shown in diagram M of FIG. 3) to the input of the lock-in amplifier 24 through the controlled switch 26.

During the measurement period $T_M$ the integrating member consisting of the resistor 28 and capacitor 29 receives the output signal of the phase-sensitive rectifier 22. Under real conditions disturbing signals can be superimposed on this output signal as it has been illustrated at section 33 in diagram E of FIG. 3. The time constant of about 1 msec of the integrating member provides that the amplifier 27 can receive only the mean value of this output signal averaged for a period of about 1 msec. During the period $T_G$ the input of the lock-in amplifier 24 receives the mean value of the rectified measuring signal averaged for a time period of 1 msec directly preceding the moment $t_o$ and hold through the full period $T_G$, and this operation is due to the specific design of the transmission gate 23.

By the above described operation of the apparatus shown in FIG. 1 many of the technical limitations of the previously used DLTS methods can be overcome. Of the advantages outstanding significance can be attributed to the direct application of the switched pulse-like excitation signal to the measuring circuit 12 without using a pulse transformer, whereby the pulse durations which have substantial influence on the measurements can be adjusted precisely within wide ranges. The application of switching elements implemented by VMOS FET switching devices does not influence the capacitance prevailing at the measuring circuit 12. By using the controlled switch 19 to short-circuit the input of the HF amplifier 18 and the following phase-sensitive rectifier 22 during the period $T_B$ of the control voltage C, the overdriving of these stages is prevented or the realization of higher gain is made possible during the measurement period $T_M$. The design of the transmission gate 23 as a switched track-and-hold stage protects the input of the lock-in amplifier 24 from being overdriven, and the sensitivity and the accuracy of the capacitance measurement is increased by supplying the averaged capacitance value to the lock-in input during the period $T_G$.

When after the end of the pulse C of the control voltage the measurement period $T_M$ is started always in identical phase conditions relative to the period time of the pulses, the various capacitance-change measurements supply evaluable and comparable results even if the period time of the pulses and the pulse-width are changing within wide limits.

For the operation of the apparatus shown in FIG. 1, the generation of the control voltages C, D, E and F will be necessary. FIG. 2 shows a schematic circuit diagram as an embodiment for the generation of these control voltages which illustrates the control unit 32.

The HF generator 10 has been indicated also on FIG. 2, and the quartz-controlled output signals of the generator 10 which have a stable frequency are used for the generation of the various control voltages. The output of the generator 10 is coupled to a frequency synthetiser 40 which is a conventional unit designed in such a way that in response to the constant frequency signals coupled to its input generates output pulses having a frequency which is 5000-times higher than the measuring frequency $f_P$ which is controlled by a frequency control signal delivered by a handling unit 41. The handling unit 41 is used to adjust the measuring frequency $f_P$ to a required value between 0.5 Hz and 2.5 kHz. The frequency synthetiser 40 is coupled to an output line 42 on which pulses with 5000 $f_P$ are present. The output line 42 is coupled to counting inputs of counters 43, 44 and 45. The counter 43 which in the exemplary embodiment provides a frequency division by 500, is coupled both to the input of a further counter 46 and to set input 48 of a store 47 associated with an error detecting unit. The counter 46 provides a frequency division by ten and the 1–0 transitions of the output of the counter 46 determine the starting moments of the control voltage C i.e. the moment $t_o$ indicated in FIG. 3. The output of the counter 46 is coupled to the starting input of a pulse generator 49 and to the clear input 50 of the store 47 and to the clear input 52 of an other store 51.

The pulse generator 49 is adapted to provide the control voltage C, and for the purpose of setting the duration $T_B$ of the voltage pulse C the pulse generator 49 receives a control signal from an appropriate output of the handling unit 41, whereby the width of the voltage pulse C can be adjusted to any required value. The upper limit for the adjustment of the duration $T_B$ is determined by the fact that the period $T_G$ which is closely related to the period $T_B$ can be maximum as long as the tenth of the period time $T_P$. This condition is required for attaining the accuracy better than 1% referred to hereinabove.

The output of the pulse generator 49 forms the output of the control unit 32 that delivers the control voltage C, and on the other hand it is coupled to the input of a delay member 53. The delay member delays the rear 1–0 edge of the control pulse C by a period of about 20 nsec. This way the output of the delay member 53 provides the control pulses D shown in FIG. 3. The output of the pulse generator 49 is coupled additionally to clear input 55 of a store 54. The inverted output of the store 54 is connected to the combined enable and clear input 56 of the counter 44. In the exemplary embodiment the counter 44 provides a frequency division by 200, and it delivers at its output a 1–0 edge when it receives the 200th control pulse following the incoming of the enabling spike. Since the output of the frequency synthetiser 40 supplies round 5000 control pulses to the counter 44 during the period time $T_P$, the frequency division by 200 realized by the counter 44 implements a delay of $T_H=T_P/25$ represented by the 1-0 transition of its output.

The output of the counter 44 is coupled to the set input of the store 54, to the set input of the store 51 and to clear input 58 of a store 57. The set input of the store 57 is connected to the output of the counter 45 which carries out a division by 2500. The inverted output of the store 57 provides the control voltage F and it is also coupled to the combined enable and clear input of the counter 45.

The inverted output of the store 51 supplies the pulses of the control voltage E. The inverted output of the store 51 is coupled to gating input (clear) 60 of a gated store 59. The set input of the store 59 is coupled to the non-inverted output of the store 47, and the output of the store 59 is connected to the input of an error indicating unit 61 comprising preferably indicator lamps.

The operation of the control unit 32 shown in FIG. 2 is as follows.

The frequency synthetiser 40 supplies pulses having 5000 times as high frequency as the measuring frequency is, and in response to these pulses the counters 43 and 46, which provide together a combined frequency division by 5000, generate respective 1-0 transition jumps that control the pulse generator 49 in the starting moments $t_o$ of each pulse of the control voltage C. The pulse generator 49 provides the pulses C at its output having a duration $T_B$ set by the handling unit 41. The delay member 53 delays the rear edge of the pulse C, whereby the pulse D of the control voltage D is obtained.

The 1-0 transition of the pulse C occurring in the moment $t_1$ clears the store 54 and the inverted output of the store 44 enables the counting operation for the counter 44 that carries out a division by 200. The output of the counter 44 provides an 1-0 transition when a time period of $T_H=T_P/25$ has elapsed since the moment $t_1$, and this 1-0 transition controls the set inputs of the stores 54 and 51 and the clear input 58 of the store 57. This transition occurs in the moment $t_3$ (FIG. 3). In response to such a control the store 54 turns in set condition, it stops the enable condition of the counter 44 and resets the same, turns the store 51 into set condition to deliver a 1-0 transition at its inverted output in the moment $t_3$, and the store preserves its set condition (0 at its inverted output) till the moment $t_o$ of the next period. In such a way the inverted output of the store 51 provides the pulse of the control voltage E. The 1-0 transition at the output of the counter 44 occurring in the moment $t_3$ will additionally clear the store 57 which responds by a 0-1 jump at its inverted output corresponding to the starting 0-1 jump of the control voltage F. This jump at the inverted output of the store 57 enables the counting operation of the counter 45 implementing a frequency division by 2500, and the output of the counter 45 provides a jump in the moment $t_4$ occurring after the 2500th pulse following the moment $t_3$ that sets the store 57. The changed state of the store 57 results in a corresponding change at the output of the control voltage F.

It should be noted that the square-wave input 30 of the lock-in amplifier 24 requires bipolar pulses, therefore the control voltage F is provided by an appropriate pulse-forming circuit (not shown in the drawing) coupled to the inverted output of the store 57.

During the time-period of $T_P/10$ following the moment $t_o$ the store 47 is in reset condition, because in the moment $t_o$ its clear input was controlled, and its set input 48 will be controlled by the output of the counter 43 when the time-period of $T_P/10$ has elapsed. Thus the non-inverted output of the store 47 is in 0 state during the first 10% of the period time $T_P$ which is followed by a 1 state in the remaining part of the period. The store 59 is designed in such a way, that the transition coupled to its gating input 60 in the moment $t_3$ can change its state only then, if the moment $t_3$ occurs later than the end of the 0.1 $T_P$ period following the moment $t_o$ when the output of the store 47 takes a logical 1 state. This means that the turning of the store 59 occurs only in cases when the period $T_G$ shown in FIG. 3 is longer than 10% of the full period time $T_P$. The error indicating unit 61 indicates the change of the state of the store 59 for the operator to adjust a shorter pulse duration by the handling unit 41.

It can be seen from the above description that the control unit 32 can supply all the control voltages required for the operation of the capacitance-change measuring apparatus shown in FIG. 1. It will also be obvious on the basis of the examples shown hereinabove, that the skilled artician can design a large number of alternative circuits for the same operation without departing from the scope and spirit of the present invention which can not be limited to any of the examples described herein.

We claim:

1. In a method for carrying out deep level transient spectroscopy scanning on a semiconductor junction containing traps in the neighborhood thereof by measuring a predetermined sequence of transient capacitance changes of said junction, in which each measurement of said sequence comprises the steps of:
   (a) applying a high frequency signal to a diode representing said junction;
   (b) applying a reverse bias voltage to said diode;
   (c) applying a voltage pulse with a predetermined duration to said diode superimposed on the reversed bias voltage to provide a substantially different charge state of said traps;
   (d) detecting the amplitude envelope of the capacitive signal component of said high frequency signal passed through said diode following the cessation of the pulse to form an input signal of a lock-in amplifier;
   (e) repeating steps (b) to (d) periodically, in which the repetition period is substantially longer than said voltage pulse and substantially longer than the period of said high frequency signal;
   (f) generating a symmetrical synchronizing pulse sequence with a repetition and duration both equal to said repetition period in such a way that a dead period elapses between the ending moment of said voltage pulse and starting moments of said synchronizing pulse sequence to form a synchronizing signal for said lock-in amplifier;
   (g) generating respective simulated signals during each of said voltage pulses and the subsequent dead periods to take values corresponding to those of said amplitude envelopes before said voltage pulses; and
   (h) connecting said simulated signals to the signal input of said lock-in amplifier during the non-existence of said amplitude envelope,
   whereby said lock-in amplifier is used to provide a weighted value of said amplitude envelope with said synchronizing pulse to represent the measure of the transient capacitance change in which during said scanning, the lengths of said dead periods being adjusted to form a predetermined same fraction of any corresponding repetition time period, and said measurements in said sequence being distinguishable in the temperature of said junction and/or in the lengths of the repetition periods and/or in the voltage pulses.

2. The method as claimed in claim 1, in which said simulated value of said envelope corresponds to an averaged value obtained during a predetermined period just preceding the occurrence of the voltage pulse.

3. The method as claimed in claim 1, in which the combined length of said voltage pulse and said dead period being shorter than a tenth of the repetition period associated therewith.

4. The method as claimed in claim 1, further comprising the step of prohibiting the passage and detection of said high frequency signal in step (d) at least during the existence of said voltage pulse and a subsequent predetermined delay time by establishing a parallel shunt-path to the ground.

5. An apparatus for measuring the transient capacitance changes of a semiconductor device containing a junction with traps, comprising:
   means for generating a high frequency signal;
   a high frequency transformer excited by said generating means and having a tapped secondary winding;
   a first electrical path coupled to a first output terminal of said secondary winding for the insertion of said diode;
   a second electrical path coupled to a second output terminal of said secondary winding comprising a variable capacitance for compensating the capacitance of the junction of said diode when inserted in said first path, the outputs of said paths being interconnected at a common point;
   means for amplifying a high frequency signal having its input coupled to the common output of said paths;
   a phase-sensitive rectifier connected to the output of the amplifying means to provide a signal being a representation of the capacitive component present at said common output;
   lock-in amplifying means having a signal input driven by the output of said phase-sensitive rectifier and a synchron input to the driven by a symmetrical square-wave signal for producing an output corresponding to said representation weighted by said square-wave signal;
   first direct current source means for supplying a first voltage signal for reverse biasing said junction;
   second direct current source means for supplying a second voltage signal for differently charging the traps in said junction;
   first controlled switch means alternatively coupling said sources to the tapping point of said transformer in response to a control pulse signal, and
   control means for generating said square-wave and pulse signals.

6. The apparatus as claimed in claim 5, further comprising second controlled switch means connected to shunt the common output of said paths in response to a second pulse signal having a slightly delayed tracing end relative to said first pulse signal, whereby the overshooting of said high frequency amplifier and the subsequent changes is prevented when said second voltage signal is coupled to the junction.

7. The apparatus as claimed in claim 5, further comprising third controlled switch means coupling the output of the phase sensitive rectifier to the input of said lock-in amplifying means, the control input of said third controlled switch means being coupled to another output of said control means supplying a control voltage which defines measuring periods.

8. The apparatus as claimed in claim 7, further comprising fourth controlled switch means controlled inversely relative to the third controlled switch means, amplifying means having integrating input characteristics in which the third controlled switch means is coupled through said integrating input amplifier and through said fourth controlled switch means to the input of the lock-in amplifying means in the first position of the fourth controlled switch means and, in the second position of the fourth controlled switch means, the output of the phase sensitive rectifier being coupled to the input of the lock-in amplifying means.

* * * * *